(12) United States Patent
Schmidt

(10) Patent No.: US 8,335,483 B2
(45) Date of Patent: Dec. 18, 2012

(54) RECEIVER DEVICE, SYSTEM, AND METHOD FOR LOW-ENERGY RECEPTION OF DATA

(75) Inventor: Frank Schmidt, Altkirchen (DE)

(73) Assignee: Frank Schmidt, Altkirchen (DE)

( * ) Notice: Subject to any disclaimer, the term of this patent is extended or adjusted under 35 U.S.C. 154(b) by 838 days.

(21) Appl. No.: 12/497,519

(22) Filed: Jul. 2, 2009

(65) Prior Publication Data
US 2010/0003937 A1 Jan. 7, 2010

(30) Foreign Application Priority Data
Jul. 2, 2008 (DE) .................. 10 2008 031 406

(51) Int. Cl.
*H04B 1/16* (2006.01)
(52) U.S. Cl. ............. 455/205; 455/226.4; 455/281; 455/323
(58) Field of Classification Search .......... 455/205, 455/214, 216.1–216.4, 280, 281, 313, 323, 455/333, 334
See application file for complete search history.

(56) References Cited

U.S. PATENT DOCUMENTS

| 5,171,733 | A | 12/1992 | Hu | |
|---|---|---|---|---|
| 5,257,407 | A * | 10/1993 | Heinzelmann | 455/67.11 |
| 5,973,613 | A | 10/1999 | Reis et al. | |
| 6,697,648 | B1 * | 2/2004 | Kaesser | 455/571 |
| 7,233,256 | B2 | 6/2007 | Schmidt et al. | |
| 7,324,837 | B2 * | 1/2008 | Yamakita | 455/561 |
| 7,831,257 | B2 * | 11/2010 | Pollman et al. | 455/453 |
| 8,140,032 | B2 * | 3/2012 | Russ | 455/115.1 |

FOREIGN PATENT DOCUMENTS

| DE | 225994 | 9/1910 |
|---|---|---|
| DE | 323197 | 7/1920 |
| EP | 0 467 036 | 1/1992 |
| EP | 1 449 309 | 8/2004 |

* cited by examiner

*Primary Examiner* — Nhan Le
(74) *Attorney, Agent, or Firm* — Foley & Lardner LLP; Matthew L. Fenselau

(57) ABSTRACT

A receiver device, A system and a method for reception of a signal having an amplitude that has been modulated with information, wherein a resistive element is provided that converts an electrical quantity into a physical parameter.

29 Claims, 4 Drawing Sheets

RECEIVER DEVICE, SYSTEM, AND METHOD FOR LOW-ENERGY RECEPTION OF DATA

RELATED APPLICATION

This application claims priority of German Application No. 10 2008 314 06.4 filed Jul. 2, 2008, the content of which is hereby incorporated by reference.

FIELD OF THE INVENTION

The invention relates to a receiver device, a system, and a method for the reception of a signal having an amplitude that has been modulated with information.

BACKGROUND OF THE INVENTION

Due to existing standards, transmission devices of wirelessly operated systems may not exceed a defined transmission power. A typical maximum transmission power is, for example, 10 mW. This corresponds to a maximum transmission level of 10 dBm. Due to this limitation of the transmission power, the range for successful transmission of information is very greatly dependent on the configuration of The receiver device. A problem that has been known for a long time and that it is essential to solve in wireless technology is the construction of receiver devices that feature high sensitivity for the signals to be received, but use little energy themselves for accurate reception of these transmitted signals.

The reception level is greatly damped relative to the transmission level. This damping is caused by the free-space transmission and effects due to interference and the surroundings. Modern wireless systems can definitely reach long ranges, but for this purpose a complicated circuit concept is provided in The receiver devices, wherein these receiver devices themselves require a lot of energy. Examples of complicated circuit concepts are complicated amplifier circuits, correlation receivers, and digital filters with digital computational units.

The decisive factor in receiver technology is the smallest possible reception level at which a signal can still be received accurately in a reception device. The smallest possible reception level is also designated as the sensitivity of The receiver device. The sensitivity is derived from the effective noise power and the necessary minimum signal-to-noise ratio of the reception signal. The noise power is derived, in turn, from the thermal noise-power density $N_0$, the bandwidth B, and the noise figure F of The receiver device. Because the noise-power density of $k*T_0=4\cdot10^{-21}$ Watt or −174 dBm per Hertz bandwidth and the bandwidth for standard wireless systems are constant, the sensitivity can be increased most effectively by means of the noise figure F of The receiver device. One goal, therefore, is to develop low-noise receiver devices, because these exhibit high sensitivity.

If a receiver device is to be built that has available only a little power-supply energy or that is to consume a little energy for the accurate reception of weak-level signals, then long ranges could not be achieved with conventional circuit concepts. This problem arises especially in energy self-sufficient or battery-operated reception devices that function, for example, according to the energy-harvesting principle. The power-supply energy is obtained from the surroundings.

Reception levels that can be processed and that lie 100 dB or more below the transmission level of 10 dBm are desirable. The receiver device should consume less than a few 100 μW for reception of the signals, in order to be able to use the energy resources for powering The receiver device for as long as possible. Higher energy input necessarily leads to higher energy consumption and thus to faster depletion of the energy resources.

Conventionally, an amplitude-modulated signal is demodulated in The receiver with an envelope-curve detector that has at least one diode in the signal path for rectifying the reception signal. A low-pass filter connected downstream filters the high frequency portions of the received signal. This type of demodulation is very ineffective for the processing of small reception levels. The diodes initially have non-linear characteristic curves. Diodes exhibit low efficiency, in particular in the sub-threshold voltage range. Indeed, in high-frequency technology, specially manufactured diodes are used that feature improved efficiency values, but there are, in addition, parasitic effects. If a demodulator is realized by means of diodes, lower reception levels, typically less than −50 dBm, could no longer be accurately received by The receiver device.

Until now, complicated circuit concepts have been used in order to be able to receive lower reception levels accurately. For example, high-frequency amplifiers are used. These high-frequency amplifiers have a minimum current consumption of a few 10 mA to 100 mA. This current consumption leads to a fast consumption of the energy resources, and is therefore especially undesirable for energy self-sufficient or battery-operated receiver devices.

A desired current-value amplitude that should be received by The receiver without errors is, for example, 1 μA. This corresponds to a reception power level of −90 dBm.

From EP 1 449 309 B1, an activation device for a circuit system that can be controlled remotely is known in which an activation signal is transformed into heat by means of a special heating element. A pyroelectrical element detects the heating of the heating element. By means of an activation circuit connected downstream, a conventional receiver circuit is activated for the reception.

In such an arrangement, it is disadvantageous that time and energy must initially be expended in order to activate the actual receiver device. In addition, the activation circuit presented does not achieve low-energy reception with high sensitivity in The receiver device, but instead merely the listening for whether a signal is present is realized with low energy.

SUMMARY OF THE INVENTION

One object of the invention is to provide a receiver device with high sensitivity, wherein the energy requirements of The receiver device are minimized, in order to receive a transmitted signal.

A receiver device with an antenna is described, wherein the antenna is constructed to provide, at the output side, an electrical quantity having an amplitude that is modulated with information. A resistive element is connected after the antenna. An evaluation unit is connected after the resistive element, wherein the evaluation unit evaluates at least one physical parameter of the resistive element. The physical parameter varies based on the amplitude modulation of the electrical quantity. The information signal is provided at the output of the evaluation unit.

Through the use of the resistive element in The receiver device, fewer parasitic effects are contained that would make the demodulation ineffective than with the use of diodes. Therefore, The receiver device exhibits high sensitivity and can accurately receive and demodulate amplitude-modulated reception levels that are less than the transmission level by multiple orders of magnitude.

Because the resistive component features a linear characteristic curve, input and output quantities of The receiver are proportional at least across a very large range of reception levels. The sensitivity is therefore significantly higher than for the use of diodes. Therefore, the reception of very small levels is possible without having to use complicated circuit concepts, for example, high-frequency amplifiers. Through appropriate dimensioning of the resistive element, it is possible to set changes in the physical parameters in proportion to changes in the amplitude-modulated electrical quantities.

Amplitude Shift Keying, abbreviated ASK, is preferably used as the amplitude modulation. Through 100% blanking of the amplitude, which corresponds to On-Off Keying, abbreviated OOK, a maximum change in the physical parameters of the resistive element is generated.

For example, the temperature is selected as a physical parameter. The resistive element changes its temperature due to changes of the amplitude-modulated electrical quantities. This temperature change can be detected with simple circuit-related means, wherein the energy demands of The receiver device for accurate reception remain low.

Other physical parameters that can be evaluated are the electrical conductance, the length, and the light intensity.

If a thermal sensor element is located in the evaluation unit connected downstream, then this temperature difference at the resistive element can be detected very easily. An advantage of this construction is the feedback-free operating principle. A thermal sensor element is, for example, a pyroelectric sensor. Alternatively, a thermoelectric sensor is used that takes advantage, for example, of the Peltier or Seebeck effect for detecting the temperature difference.

Preferably, at least the resistive element is manufactured using microtechnology or nanotechnology. Structural sizes in the range of nanometers can be easily realized today. Therefore, the resistive element has very small dimensions, whereby the physical parameters of the resistive element could be evaluated with very good results. If additional elements of The receiver device are manufactured using microtechnology, then the effect of interference quantities is minimized and the entire receiver device is more sensitive relative to lower reception levels.

In another construction, the evaluation unit has a difference unit. This difference unit has a first and a second input and also an output. At the first input, the varying physical parameters of the resistive element are first converted into an electrical quantity and then provided to the first input of the difference unit. At the second input, the same physical parameter of a resistive reference element is similarly first converted into an electrical quantity independent of the electrical quantity provided by the antenna, and then provided to the second input of the difference unit. At the output, the difference of the two electrical quantities is provided. The resistive element is insulated from the amplitude-modulated electrical quantity, so that those varying physical parameter changes that are not caused by the varying electrical quantity are compensated in the difference unit. Because the physical parameter also depends on environmental variables, for example, ambient temperature, vibrations, and electromagnetic interference sources, the parameter does not necessarily have a linear behavior. Through this construction, additive interferences could be compensated in a very simple way.

In another construction, an element limiting the frequency band of the electrical quantity is arranged between the antenna and resistive element. Because the antenna usually has a very broadband reception, through this measure frequency portions could be filtered out that do not belong to the spectrum of the amplitude-modulated transmission signal.

In another construction, The receiver device has a correlation unit in the evaluation unit. In this way, identification features are recognized that are present in the reception signal. The receiver device thus recognizes whether the received signal is provided for this receiver device. For a positive correlation result, the information signal is forwarded and a downstream unit is activated. For a negative correlation result, the information signal is not forwarded and the downstream unit remains in a deactivated state. Through a correlation unit, The receiver device is made more sensitive and can thus accurately process lower reception levels. If the reception signal has a strong noise portion, the information signal can be calculated despite the high noise level by means of suitable correlation algorithms in the correlation units.

In addition, an excess level protection device in The receiver device could be provided, wherein it is guaranteed that the resistive element is no longer burdened with an overvoltage or an excess level. This overloading could possibly destroy the resistive element, but, at the least, it would not work correctly.

It is further provided to introduce an amplifying element limiting the frequency band at the output of the evaluation circuit, wherein the demodulated signal could be processed better and with more stability.

Furthermore, A system with a transmitter device and at least one receiver device is provided. A sensor records data and sends this data to a transmitter device. The transmitter device modulates this data by means of amplitude modulation and transmits the data to a receiver device. The receiver device makes the demodulated data available at its output.

Up until now, wireless systems have been operated in a time-slice method in order to save energy. These are synchronous methods that require time management. That is, the transmitter and receiver devices agree on a time at which the data to be transmitted is sent. This takes place in a certain time interval, for example, a 10 ms transmission within one minute. Outside of the transmission time, the transmitter and receiver devices are deactivated. This has the disadvantage that a change in data is transmitted to a sensor only at the agreed time. If the value changes up to then, this results in undesired data loss. For example, the transmission of a temperature value via such A system is non-critical, because a temperature value changes only slowly. However, there are time-critical applications. For example, in hazard sensors, real-time transmission is essential for switching elements.

Therefore, this system is made from several transmitter and receiver devices. Each transmitted signal contains a special identification mark with which a certain receiver device is addressed. If a receiver device recognizes that it is not addressed, then The receiver device blocks the data. This can be realized, for example, by means of correlation calculation. Wireless switches, for example, could be operated by means of such A system.

The system operates completely asynchronously, which means that real-time operation is possible. If data or information is available at a sensor, it is amplitude modulated ad hoc by the transmitter device and transmitted.

Optionally, the transmitter device appends an identification mark to the transmission signal in order to address a certain receiver device. Possible data loss is thus prevented.

In another construction of the system, the demodulated signal in The receiver device is made available to a downstream unit for further processing. For this purpose, for example, bus systems are provided to which each receiver device is connected. By networking The receiver devices, it is also possible that the data or information is simultaneously transmitted via several paths.

Alternatively, The receiver device operates as a repeater and regenerates the received signal. In this case, The receiver device has an additional module that modulates and transmits the regenerated signal again.

In an alternative construction, the system has nodes that are energy self-sufficient and that are equipped at least partially with the described receiver devices, in order to be able to receive and forward a signal also across large ranges. In this way, the energy self-sufficient nodes are powered by means of environmental energy, for example, solar energy.

A receiver device according to the invention is used, for example, as a part in a wireless sensor network. The wireless sensor network can have a few battery-operated switching or distributing nodes. Additionally or alternatively, these nodes could be energy self-sufficient. Information within the wireless sensor network is forwarded by means of suitable routing methods.

In telecommunications, "routing" designates the establishment of paths for flows of messages in communications via interconnected communications networks or computer networks. Routing defines the entire path of a message flow through the network.

Example routing methods with which A system according to the invention could be operated are described in co-pending application Ser. No. 12/497,526 for "Initialization Method ad Operating Method for a Wireless Network" (Attorney docket no. 5367-490).

Finally, a method for the energy-saving detection of amplitude-modulated signals is provided wherein, in a first processing step, the conversion of a variable electromagnetic quantity into an electrical quantity is provided, then a conversion of the electrical quantity into a different physical quantity is performed by means of a resistive element, then an evaluation of the physical quantity varies based on the amplitude change, and finally the evaluation result is interpreted as a non-modulated signal.

BRIEF DESCRIPTION OF THE DRAWINGS

Below, embodiments of the invention will be described in detail with reference to the figures. Components that are the same or that have the same action are provided with the same reference symbols in the figures. Individual elements may be shown disproportionately large or extremely simplified.

Shown are.

DETAILED DESCRIPTION OF THE DRAWINGS

Figure 1:
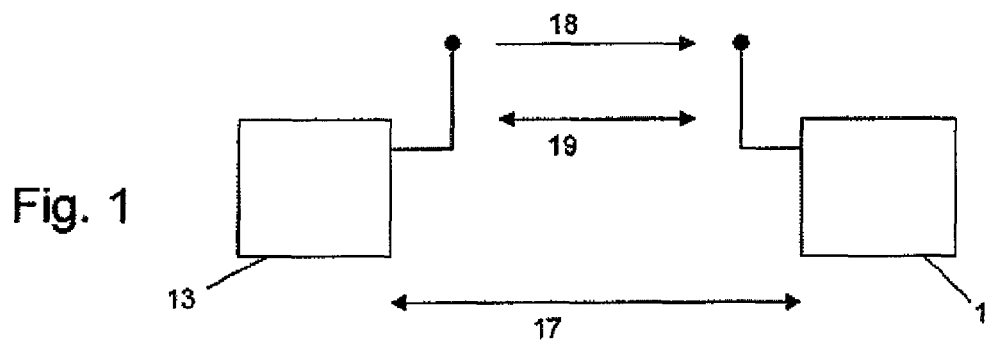
FIG. 1, a wireless transmission system.

The arrangement shown in FIG. 1 illustrates the problems described above. A transmitter device 13 transmits an amplitude-modulated signal with, for example, a maximum power of 10 mW or +10 dBm. A remote receiver device 1 receives this amplitude-modulated signal. In this way, unidirectional and also bidirectional transmission is possible. In a simple and power-saving case, the transmission is unidirectional from the transmitter device 13 to The receiver device 1. Due to the long distance, a high degree of level damping, for example 100 dB, is to be expected. The level damping is based on free-space damping and interference and environmental influences. At a transmission level of +10 dBm and damping of 100 dB, a reception level of −90 dBm is found, which corresponds to a reception power of 10 nW.

For transmitting information, the information to be transmitted is amplitude modulated in the transmitter device 13 and then transmitted. A large amplitude swing is advantageous, ideally the amplitude swing is equal to 1, because this generates a greatly oscillating amplitude of the transmission signal. In addition, the ratio of the carrier frequency to the information frequency is greater than 1000. Typical carrier frequencies lie between 100 MHz and 10 GHz. For example, for digital information signals, an information signal has a frequency of 100 kHz or 100 kBit/s.

Figure 10:
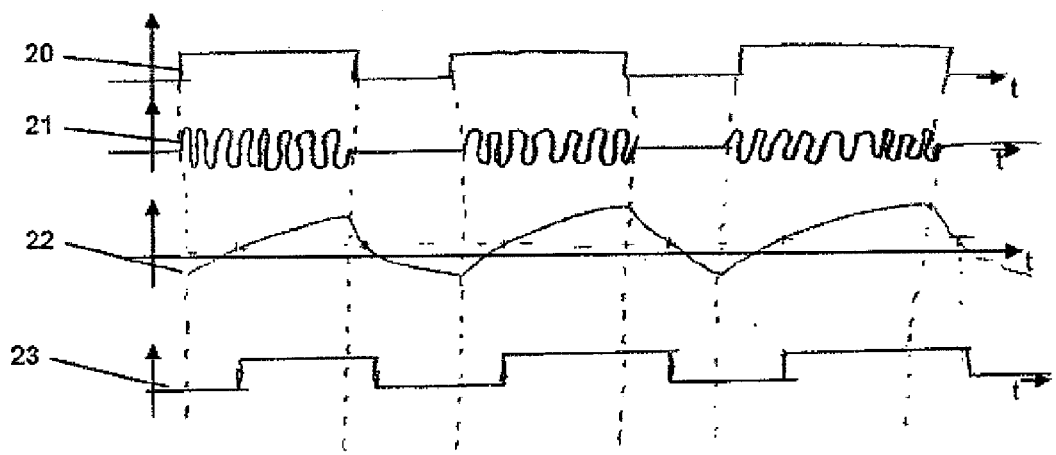

Preferably, the information signal is of a digital nature and is transmitted by digital amplitude modulation, for example, amplitude-shift-keying (ASK). On-Off Keying (OOK) is a preferred method because a first binary state of the information is transmitted without the carrier frequency and a second binary state of the information is transmitted with the much higher carrier frequency. This corresponds to an amplitude blanking of 100%. A typical signal profile of a digital information signal 20 and of a modulated signal 21 is shown in FIG. 10. The data or information is sensor data, for example.

The transmission of information or data takes place preferably in the ISM frequency bands. The ISM bands are set by the Radiocommunications Sector of the International Telecommunications Union, (ITU-R). Preferred frequencies are to be used depending on the region in which such wireless transmissions take place. For example, in the region of the US, a frequency of 315 MHz is preferred; in the EU region, the frequencies 868 MHz or 2.4-2.5 GHz are used. The transmission could also be performed using a protocol-based method. The standards Bluetooth, ZigBee, and Z-Wave with the corresponding transmission frequencies can be named as examples.

Figure 2:
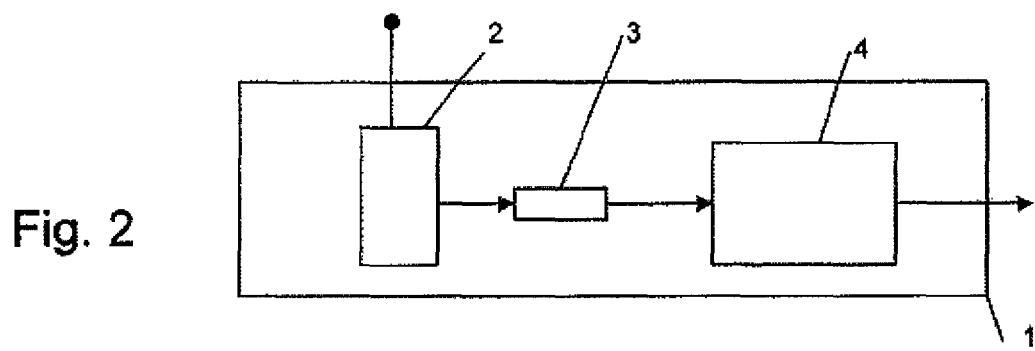
FIG. 2, a first embodiment of a receiver device according to the invention.

In FIG. 2, a first embodiment of The receiver device 1 is described. This receiver device 1 includes an antenna 2, a downstream resistive element 3, and an evaluation unit 4 connected after the resistive element 3.

The antenna 2 converts a variable electromagnetic field quantity into an amplitude-modulated electrical quantity and provides this electrical quantity at the output. The antenna is, for example, a dipole antenna. The downstream resistive element 3 converts this electrical quantity into a physical parameter. As the resistive element, an electrical resistor is preferably used. The downstream evaluation unit 4 evaluates this physical parameter, wherein this parameter varies with the amplitude of the received signal. In FIG. 10, as an example, the varying of the physical parameter temperature 22 is shown as a function of the modulated signal 21. The detected information signal 23 that corresponds to the original signal is provided at the output of the evaluation unit 4.

As the resistive element 3, a two-terminal element from electrical engineering is understood that has proportionality between current and voltage to as great a degree as possible. The current and voltage are in-phase. This resistive element 3 has physical parameters that either change proportionally to a change in the amplitude-modulated electrical quantity, or whose changes sum together in terms of magnitude with each carrier frequency oscillation. As physical parameters, for example, temperature, conductivity, and length shall be named. These parameters will now be evaluated by means of suitable sensors.

If the temperature is analyzed as a physical parameter, then in particular, sensors are used that detect the heat radiation of the resistive element 3. Through detection of the varying heat radiation, a feedback-free reading of the reception level is possible. In this way, the resistive element 3 is not loaded. Alternatively, a sensor element could also be used that evaluates the heat conductivity as a varying physical parameter of the resistive element. Alternatively, sensors are used that evaluate physical parameters that can be derived from the change in heat.

Without a received and applied electrical quantity, the electrons move randomly in the atom lattice of the resistive element 3, which is also called Brownian motion. If an amplitude-modulated electrical quantity is now applied to the resistive element, then the free electrons are accelerated by the electric field in the direction of the field lines within the lattice. An electrical current flows.

In their paths through the resistive element, the electrons undergo elastic impacts with other electrons. In this way, the electrons impart energy to their impact partners. The electrons are constantly decelerated by these impacts and an average flow rate is set. In addition, the entirety of the energy is not transmitted to the impact partner, but instead a portion of this energy is converted into other forms of energy, for example, thermal energy.

For amplitude-modulated signals, the ratio of carrier frequency to information signal frequency is selected so that ideally it is large. For example, 1-bit information could feature many thousands of carrier frequency oscillations. At a data rate of 125 kBit/s, the time period of one bit is 8 µs. This is indicated in FIG. 10. Each of these carrier frequency oscillations that have both positive and also negative voltage amplitudes generates, in the resistive element 3, a change in the physical parameter to be examined.

Through this variable physical parameter, the change in the amplitude-modulated electrical quantity can be easily detected in the evaluation unit.

Through corresponding dimensioning of the resistive element 3, it is possible to set changes in the physical parameters proportional to changes in the amplitude-modulated electrical quantities, wherein this proportion is easy to evaluate.

In the following, a possibility will now be described as an example of how a physical parameter of the resistive element 3 is evaluated.

For a resistive element 3, in particular, materials are considered that are already regularly used today in microtechnology. As an example, in the following examination, a resistive element 3 made from aluminum is used. A few significant parameters of aluminum are listed as follows:

specific resistance Rho: $=2.64*10^{-8}$ Ohm*m
specific material density d: $=2700$ Kg/m$^3$
specific heat capacity c: $=900$ J/(Kg*K)

In order to be able to easily detect changes in the physical parameter, the resistive element is built as small as possible. That is, the dimensions of the resistive element should be very small in order to achieve a sufficient change for low reception levels. Below, structural sizes of a resistive element are listed that can already be processed today using appropriate microtechnology or nanotechnology.

Length l: $=180$ nm
Height h: $=4.5$ nm
Width b: $=90$ nm

This produces a weight m of the resistive element 3 of:

$$m=l*b*h*d=1.97*10^{-19} \text{ Kg}$$

and an Ohmic direct-current resistance R of the resistive element 3 of:

$$R=Rho*l/(h*b)=11.7 \text{ Ohm}$$

The resistance R of the resistive element 3 is important in order to obtain efficient high-frequency power matching to the reception antenna. Ohmic active resistance values R between approximately 5 Ohm and 300 Ohm satisfy this condition well.

Figure 3:
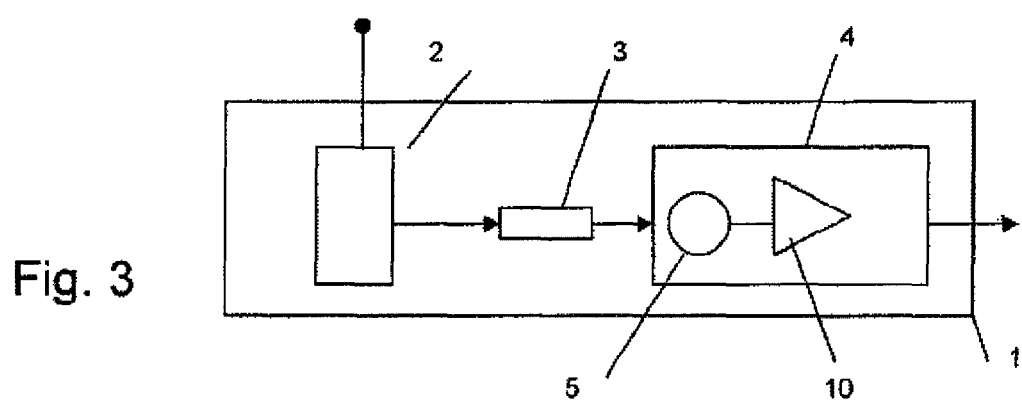
FIG. 3, an improvement of The receiver device shown in FIG. 2.

In FIG. 3, an improvement of The receiver device 1 shown in FIG. 2 is shown. Below, only the differences with FIG. 2 will be discussed in order to avoid repetitions. In FIG. 3, the evaluation unit 4 also has a temperature sensor 5. This temperature sensor 5 is, for example, a pyroelectric or a thermoelectric sensor.

The required energy for a change in temperature of one Kelvin at the sensor element is calculated from:

$$E=c*m=1.77*10^{16} \text{ Ws/K}$$

This means a quantity of energy of $1.77*10^{-16}$ Ws is needed to heat, for example, a temperature sensor 5 by 1 K. It was initially neglected that the surroundings of the temperature sensor 5 are also heated, which results in a lesser effect.

For example, in The receiver device 11 as discussed above, the goal is a limiting sensitivity for The receiver of −95 dBm. This goal must be considered together with the selected bandwidth of the wireless transmission.

The minimum reception power P0 at −95 dBm is thus:

$$P0=3.16*10^{-13} \text{ W}$$

The duration of a digital "1" bit at a data rate of 125 kBit/s equals 8 µs, from which the energy E1 of a logical 1 equals:

$$E1=2.53*10^{-18} \text{ Ws}$$

The resulting temperature increase for a received "1" bit at a resistive element with the above dimensions is thus:

$$\times dT=E1/E=0.014 \text{K}.$$

This calculation shows that, for the selected dimensioning of the resistive element 3, heating on the order of magnitude of 1/100 K could be expected when an individual bit is received at the limiting sensitivity.

This temperature sensor 5 evaluates the physical parameter temperature of the resistive element 3. By means of an amplifier circuit 10, the unmodulated signal is made available at the output of the evaluation unit 4.

If the physical parameter to be studied is temperature, then each carrier oscillation generates an increase in temperature in the resistive element 3. With each carrier frequency oscillation, the temperature value is summed. Through this summing of the temperature value with each carrier oscillation, a temperature value difference that is easily detectable is generated during one unit of information, for example, one bit. The magnitude of the absolute temperature difference between the beginning and end of one oscillation of useful information is defined decisively by the ratio between the carrier frequency and information frequency. The higher the ratio is, the higher the temperature difference is between two units of information.

A pyroelectric sensor has a polarized crystal as a material, wherein electrodes are mounted on the crystal on two opposite sides. If thermal radiation strikes an electrode, then the polarization of the crystal changes due to the temperature difference. Thus, an electric signal is generated that corresponds to the information, that is, to the demodulated signal.

Alternatively, the specific resistance can be detected as a physical parameter. The specific resistance or also resistivity is a temperature-dependent material constant identified with the symbol ρ, the Greek letter rho. The electrical resistance of a homogeneous resistive element 3 can be calculated from the values of the material. The reciprocal of the specific resistance is the electrical conductivity κ, the Greek letter kappa. For the detection of the variation in this physical parameter, the use of thermistors as the resistive element 3 is to be provided.

A thermistor is a temperature-dependent electrical resistor that changes its resistance value considerably in a desired way as a function of temperature, due to a high temperature coefficient of the material-specific electrical resistor. One distinguishes between hot conductors in which the resistance value decreases with increasing temperature and cold conductors in which the resistance value increases with increasing temperature. If the varying electrical quantity is applied to the thermistor, then for suitable dimensioning, the temperature in the thermistor will increase. This change in temperature is reflected in the change in the specific resistance that can in turn be detected, especially by means of the resistance measurement mechanism.

For detecting the electrical conductivity, a varistor could alternatively be provided as the resistive element 3. A varistor is a voltage-dependent resistor. The characteristic curve is symmetric to voltage. Polarity consequently plays no role. Varistors are also called VDR. VDR stands for Voltage Dependent Resistor.

In an alternative, embodiment (not shown), at least one geometric dimension of the resistive element 3 is analyzed as a physical parameter. The length will now be advantageously examined. The term length is understood to be a dimension to be examined in the resistive element 3; consequently there is no restriction with respect to length, width, or height. The change in length can be detected through suitable dimension sensors. The term length is also to be understood as any type of mechanical deformation, also including bending of the resistive element due to the variable electrical quantity.

Preferably, the receiver device is manufactured at least partially using semiconductor technology. As methods for this production, microtechnologies, for example, thin-film technology, nanotechnology, or other semiconductor technologies, are suitable in which the resistive element can be manufactured precisely. Through the integration of at least the resistive element it is achieved that the resistive element has minimal dimensions, wherein even minimal changes in the physical parameter to be examined can be detected.

In one improvement, additional units, for example, the sensor and the evaluation unit, are integrated into The receiver device in order to keep to a minimum the effects of disturbances, for example, ambient temperature, vibration, electromagnetic effects. Ideally, a large part of The receiver device is integrated.

Figure 4:
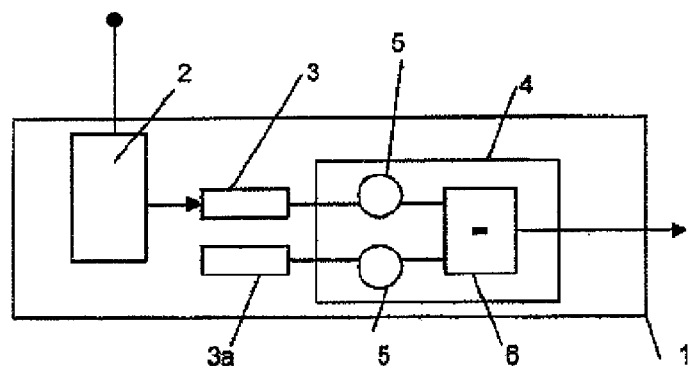
FIG. 4, an improvement of The receiver device shown in FIG. 2.

FIG. 4 shows an alternative improvement to The receiver device 1 shown in FIG. 3. In contrast to FIG. 3, FIG. 4 has a difference unit 6. The difference unit 6 has a first and a second input, as well as an output, wherein the first input is connected to the output of the sensor element that detects the varying physical parameter of the resistive element 3. The second input of the difference unit 6 is connected to the output of a second sensor element that detects the same physical parameter of a resistive reference element 3a. This resistive reference element 3a is preferably dimensioned exactly, and produced using the same technology, as the resistive element 3. The resistive reference element 3a is arranged insulated from the varying electrical quantity. Thus, the relative difference in the varying physical parameter can be detected at the output of the difference unit without additive interference effects.

Figure 5:
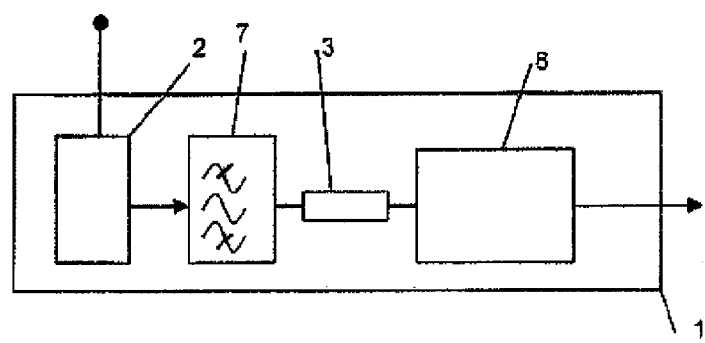
FIG. 5, an improvement of The receiver device shown in FIG. 2.

In FIG. 5, an alternative improvement to The receiver device 1 shown in FIG. 3 is shown. Instead of the difference unit 6, in FIG. 5 there is a correlation unit 8. This correlation unit 8 determines whether the received amplitude-modulated signal is intended for The receiver device. Details of the correlation unit 8 will not be discussed here because these are known to someone skilled in the art. The sensitivity of The receiver device is further increased by the correlation unit 8. In particular, signals that are very noisy can be detected well by means of correlation.

In addition, a bandpass filter 7 is provided between the resistive element 3 and the antenna 2. This band-limiting element 7 limits the received signal in the frequency range and filters out the frequency portions of the reception signal that do not belong to the information portion of the amplitude-modulated signal. This band-limiting element 7 is used especially when the antenna 2 has a very wideband reception range.

Figure 6:
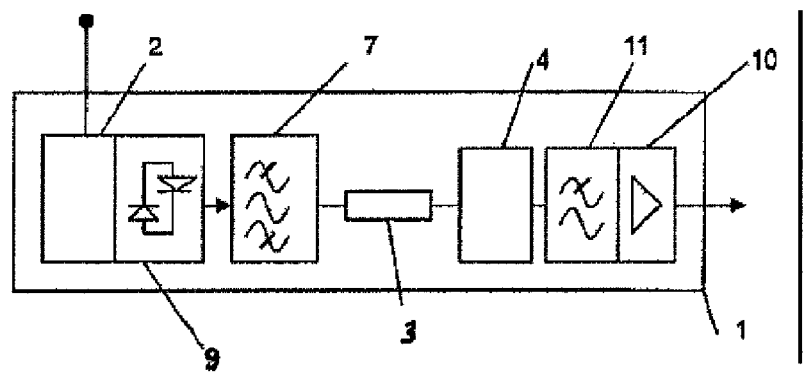
FIG. 6, an improvement of The receiver device shown in FIG. 2.

FIG. 6 shows an alternative improvement to The receiver device 1 shown in FIG. 5. The receiver device 1 has an excess level protection device 9 in the reception path between the antenna 2 and band-limiting element 7. If the received level is above a certain level range, then this excess level protection unit 9 limits this level in order to protect the resistive element from destruction or from false detections. Furthermore, after the evaluation unit 4 there is another band-limiting element, preferably a low-pass filter 11, and an amplifying element 10.

In general it is to be said that at least the resistive element 3 and the evaluation unit of The receiver device 1 are to be constructed as an integrated circuit.

Figure 7:
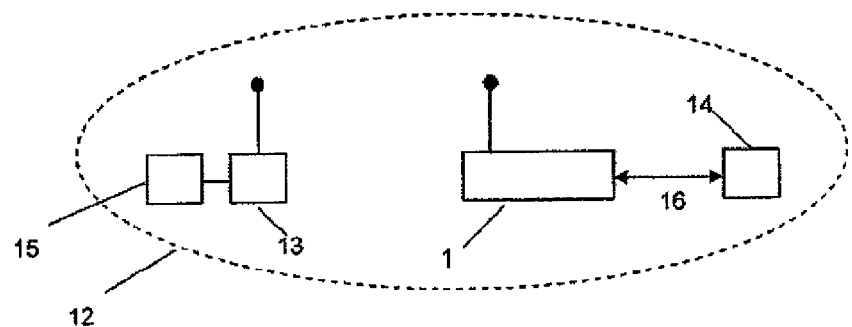
FIG. 7, A system according to the invention with transmitter device and receiver device, FIG. 8, an alternative system to the system shown in FIG. 7, FIG. 9, A system combination according to the invention of receiver devices, FIG. 10, a typical signal profile of a receiver device shown in FIG. 3.

In FIG. 7, a system is shown in which a transmitter device 13 transmits the information received by the sensor 15 by means of amplitude modulation to a receiver device 1. The receiver device 1 is built according to the type described above. The information provided at the output of The receiver device 1 is transmitted by means of bus topology 16 to a further processing unit 14. This further processing unit 14 can be an actuator. A simple example is a wireless switch. The activated switch represents the sensor 15 that turns a certain unit 14 on or off for information. Because the unit 14 must be uniquely identified, an identification mark is preferably also sent as information that reports to the correct receiver device 1 that it specifically is being addressed. As the unit 14, for example, a light source, a motor controller, or the like is conceivable. The further processing unit 14 can alternatively also be understood to be a data-processing system that evaluates the sensor data or information. Preferably, this system is used in building engineering.

The system operates with low energy receiver devices 1 and is, therefore, preferred for use in energy harvesting systems.

The system alternatively also has nodes that are energy self-sufficient and that receive and amplify the information or data. Such a node is also called a repeater, and regenerates the information signal. In the reception module of the node there is again a receiver device 1 as is shown in FIGS. 2 to 6. An identification label is not present in the node.

The node draws its power-supply energy from the surroundings. For this purpose, at least one converter is used that converts environmental energy into electrical energy. Several converters with partially different conversion principles could also be used. For example, the power supply energy is obtained by means of photovoltaic cells. In this way, radiation energy, in particular, solar radiation energy is converted into electrical energy. Alternatively, mechanical-electrical converters could also be used that take advantage of, for example, a piezoelectric effect, in particular to convert energy from mechanical vibrations into electrical power-supply energy. Alternatively, the use of thermal-electric converters is provided that take advantage of temperature changes in the surroundings, for example, the discharge of heat from machines and motors or the day/night temperature difference, in order to obtain electrical energy. Alternatively, the use of wind generators is also conceivable. The type of energy generation is in no way limited, and an arbitrary combination of different converters is conceivable.

Through this energy self-sufficient node, the range between the transmitter device 13 and receiver device 1 is significantly increased.

Figure 8:
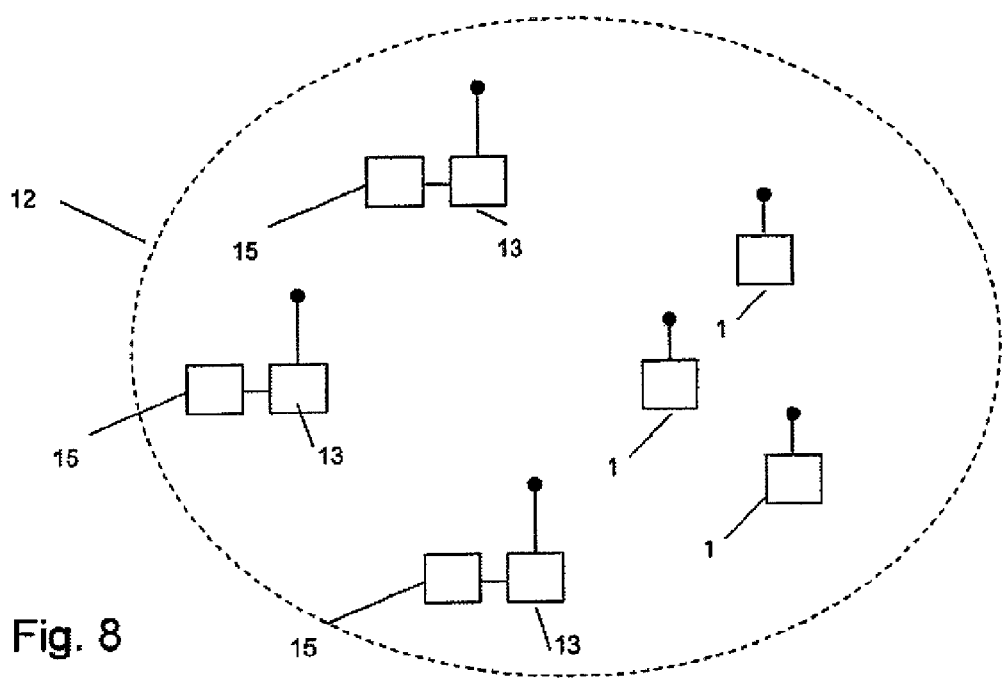

In FIG. 8, an alternative system is shown. Three transmitter devices 13 and three receiver devices 1 are provided. Each transmitter device 13 is connected to a sensor 15 and can generate an amplitude-modulated transmission signal that includes a special identification mark in the signal. With this identification mark, a certain receiver device 1 is addressed. For a negative identification detection, the two other receiver devices 1 ignore the received signal. Thus, for example, three wireless switches could transmit via one transmission frequency and the respective receiver device 1 provided for receiving the information receives the data correctly.

Figure 9:
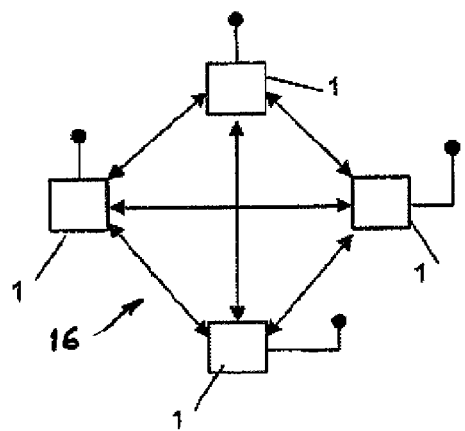

In FIG. 9, a bus topology 16 is also shown that represents an interconnection of receiver devices 1 with each other. The receiver devices 1 have additional transmitter elements or connection elements, in order to communicate with additional receiver devices 1.

The presented systems are also preferred for energy harvesting systems. Energy harvesting systems are understood to be energy self-sufficient receiver and transmitter devices that draw the power they need for operation from environmental variables.

In addition, a method for the energy-saving reception of a signal having an amplitude that has been modulated with information is provided. For this purpose, in a receiver device 1, initially a variable electromagnetic field quantity is converted into an amplitude-modulated electrical quantity by means of an antenna 2. In the next step, the electrical quantity is converted into another physical quantity by means of a resistive element 3. Then the evaluation of at least one of the physical quantities that vary based on the change in amplitude is performed. Finally, the information signal is provided.

Alternatively, during the method, the evaluation is performed by means of a difference formation with a reference value. In this way, additive interference effects are compensated.

Alternatively, during the method, the evaluation is performed by means of a correlation. In this way, the sensitivity in The receiver device 1 is further increased.

Such a receiver device 1 is used, for example, as a part in a wireless sensor network. The wireless sensor network can have a few battery-operated switching or distributing nodes. Additionally or alternatively, these nodes could be energy self-sufficient, i.e., could be nodes operated with environmental energy. Information within the wireless sensor network is forwarded by means of suitable routing methods.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A receiver device comprising:
an antenna configured to provide, at an output thereof, an electrical quantity modulated in amplitude with information;
a resistive element coupled to receive the antenna output; and
an evaluation unit connected after the resistive element, wherein the evaluation unit is configured to:
evaluate a modification of at least one physical parameter of the resistive element, in comparison to a load with an unmodulated electrical quantity,
a signal related to the physical parameter varies due to the amplitude modulation of the electrical quantity, and
the information is provided at an output of the evaluation unit.

2. The receiver device according to claim 1, wherein the physical parameter is temperature, a geometric dimension, the light intensity, and/or the electrical conductance.

3. The receiver device according to claim 1, wherein the evaluation unit includes a measurement sensor for the physical parameter.

4. The receiver device according to claim 3, wherein the physical parameter is temperature and the measurement sensor is a pyroelectric or a thermoelectric sensor.

5. The receiver device according to claim 2, wherein the resistive element is a thermistor or a varistor for evaluating the electrical conductivity.

6. The receiver device according to claim 1, wherein the evaluation unit has a difference unit comprising a first input, a second input, and an output,
wherein at the first input, the varying physical parameter of the resistive element is applied converted into an electrical quantity,
wherein at the second input, the same physical parameter of a resistive reference element is applied converted into an electrical quantity independent of the electrical quantity provided by the antenna, and
wherein at the output, the difference of the two electrical quantities is provided.

7. The receiver device according to claim 1, wherein an element limiting the frequency band of the electrical quantity is arranged between the antenna and resistive element.

8. The receiver device according to claim 1, wherein the evaluation unit comprises a correlation unit.

9. The receiver device according to claim 1, wherein the receiver device includes an excess level protection unit that is coupled with the antenna and the resistive element such that the excess level protection unit forwards the electrical quantity only when the reception level can be handled by the resistive element.

10. The receiver device according to claim 1, wherein the evaluation unit includes an output unit amplifying the information signal and limiting the frequency band of the electrical quantity.

11. The receiver device according to claim 1, wherein at least the resistive element is constructed as an integrated circuit using microtechnology or nanotechnology.

12. The receiver device according to claim 1, wherein The receiver device is constructed as an integrated circuit using microtechnology or nanotechnology.

13. A system with a transmitter device and at least one receiver device according to claim 1, wherein the transmitter device is configured to record data or commands of a sensor or input device, and transmit the data or commands using amplitude modulation, and the data or commands are provided at the output of The receiver device as a demodulated signal.

14. The system according to claim 13, wherein:
several receiver devices and several transmitter devices are arranged in the system,
each transmitted signal contains an identification mark, and
a unit is connected after each receiver device, and the downstream unit of a certain receiver device is activated with the identification mark, and the downstream units of the other receiver devices remain deactivated.

15. The system according to claim 13, wherein the system is configured to operate completely asynchronously.

16. The system according to claim 13, wherein The receiver device provides the data via a bus system of the downstream unit.

17. The system according to claim 13, wherein at least one node that operates as a repeater is arranged in the system.

18. The system according to claim 17, wherein the node is energy self-sufficient.

19. A wireless sensor network comprising at least one receiver device according to claim 1.

20. The wireless sensor network according to claim 19, wherein at least one of The receiver devices is installed in a battery-operated wireless sensor node of the wireless sensor network.

21. The wireless sensor network according to claim 19, wherein at least one of the receiver devices is installed in a wireless sensor node operated with environmental energy in the wireless sensor network.

22. The wireless sensor network according to claim 19, wherein the information in the wireless sensor network is forwarded by means of routing methods.

23. A method for an energy-saving reception of a signal having an amplitude that has been modulated with information in a receiver device according to claim 1, comprising the steps of:
converting a variable electromagnetic field quantity into an amplitude-modulated electrical quantity with an antenna;
converting the electrical quantity into a different physical quantity with a resistive element;
evaluating at least one of the physical quantities that vary based on the change in amplitude, by comparing with a conversion of an unmodulated electrical quantity into a different physical quantity; and
providing the information signal.

24. The method according to claim 23, wherein a difference with a reference value is formed for evaluation.

25. The method according to claim 23, wherein a correlation is performed for evaluation.

26. The method according to claim 23, wherein the electrical quantity is band-limited between the conversion into an electrical quantity and conversion into a physical quantity.

27. The method according to claim 23, wherein the resistive element is protected by an excess level protection unit from input levels that are too high.

28. The method according to claim 23, wherein the information signal is amplified and band-limited after it is provided.

29. The method according to claim 23 operated in a system comprising a transmitter device and at least one said receiver device, wherein the transmitter device is configured to:
record data or commands of a sensor or input device, and transmit the data or commands using amplitude modulation, and the data or commands are provided at the output of said receiver device as a demodulated signal.

* * * * *